(12) United States Patent
Lee

(10) Patent No.: US 7,582,834 B2
(45) Date of Patent: Sep. 1, 2009

(54) PRINTED CIRCUIT BOARD HAVING REDUCED MOUNTING HEIGHT

(75) Inventor: Kwan Yul Lee, Anyang-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 665 days.

(21) Appl. No.: 11/320,861

(22) Filed: Dec. 30, 2005

(65) Prior Publication Data

US 2006/0145358 A1   Jul. 6, 2006

(30) Foreign Application Priority Data

Dec. 31, 2004   (KR) .................. 10-2004-0118477

(51) Int. Cl.
*H05K 1/16* (2006.01)
(52) U.S. Cl. ................................. 174/260; 361/761
(58) Field of Classification Search ......... 361/761–794; 174/260, 252
See application file for complete search history.

(56) References Cited

U.S. PATENT DOCUMENTS 5,590,029 A * 12/1996 Estes ......................... 361/760
6,884,943 B1 * 4/2005 Gonzalez et al. ............ 174/260
7,289,335 B2 * 10/2007 Callahan et al. ............. 361/803

* cited by examiner

*Primary Examiner*—Jeremy C Norris
(74) *Attorney, Agent, or Firm*—Lowe Hauptman Ham & Berner, LLP

(57) ABSTRACT

A printed circuit board including an opening for receiving a semiconductor package having a plurality of external connections which protrude externally from side surfaces of the semiconductor package. The board also includes a plurality of board connectors electrically interconnected to the plurality of external connections of the package and formed on sidewall of the opening, wiring patterns for electrically interconnect electronic components mounted on the printed circuit board and being electrically interconnected to the plurality of board connectors, a plurality of holes penetrating the printed circuit board, and a fastener inserted into the plurality of holes and for fastening the semiconductor package received in the opening.

12 Claims, 7 Drawing Sheets

PRINTED CIRCUIT BOARD HAVING REDUCED MOUNTING HEIGHT

CROSS REFERENCE TO RELATED APPLICATIONS

This U.S. non-provisional application claims priority under 35 U.S.C. §119 from Korean Patent Application No. 2004-118477, which was filed in the Korean Intellectual Property Office on Dec. 31, 2004, the contents of which are incorporated by reference herein in its entirety.

BACKGROUND OF THE INVENTION

1. Field of the Invention

The present invention generally relates to printed circuit board (PCB) technologies and, more particularly to PCBs having reduced mounting height.

2. Discussion of the Background

An assembly process of semiconductor devices starts with isolation of individual chips from a wafer. Each of the isolated chips is electrically interconnected to a lead frame and encapsulated by a molding compound (package body) for protecting the electrical interconnection and the chip from harmful external environment. The semiconductor chip under the assembly process is referred to as "semiconductor chip device", while the packaged chip after the assembly process is referred to as "semiconductor package device".

The semiconductor package device has various mounting structures on a circuit board (PCB), which includes dual in-line package (DIP), pin grid array package (PGA), J-shaped bent outer leads, gull-wing, straight lead, pin grid array (PGA) package, and ball grid array (BGA) package structures. The BGA package provides a relatively high surface-mount density and improved electrical performance when compared with the conventional plastic package structures employing the metal lead frame.

FIG. 1 is a cross-sectional view illustrating mounting structure of the conventional BGA package 20 on a PCB 10.

A primary difference between the BGA package 20 and a conventional plastic package is that the electrical connection between the package device and the PCB 10 is provided by a plurality of solder balls 22. The solder balls 22 are attached to the bottom surface of the package device 20 in an array pattern so that the area occupied by the BGA package on the PCB 10 is smaller than that of a conventional plastic package with peripheral terminals. That is, the BGA package device 20 is surface-mounted onto the PCB 10 that includes a plurality of solder ball pads 12 and wiring patterns 14.

In terms of mounting density in vertical direction, the mounting height of the BGA package on the PCB is determined by two factors: the thickness of the package 20; and the diameter of solder balls 22. Therefore, if the mounting structure of BGA package is fundamentally modified from the conventional one, dramatic reduction in the mounting height is possible.

SUMMARY OF THE INVENTION

It is therefore an object of the present invention to provide a new structure of circuit board that can dramatically reduce the package mounting height.

Another purpose of the present invention is to provide a circuit board that can achieve the miniaturization of electronic devices.

According to an embodiment of the present invention, a printed circuit board comprises: an opening for receiving a semiconductor package having a plurality of external connections which protrude externally from side surfaces of the semiconductor package; a plurality of board connectors electrically interconnected to the plurality of external connections of the package and formed on sidewall of the opening; wiring patterns for electrically interconnect electronic components mounted on the printed circuit board and being electrically interconnected to the plurality of board connectors; a plurality of holes penetrating the printed circuit board; and fastening means inserted into the plurality of holes and for fastening the semiconductor package received in the opening.

The PCB of the present invention receives the package device in an opening penetrating the board in vertical direction and electrical interconnection between the PCB and the package device is made within the opening. As a result, the package device and interconnections (such as solder balls) of the package device do not contribute the increase of the mounting height. Further, the package device is mounted on the PCB in a detachable way by the fastening means, and hence the replacement of the package device does not cause any damage to the PCB.

BRIEF DESCRIPTION OF DRAWINGS

The present invention may be best understood by reading the disclosure with reference to the drawings.

DETAILED DESCRIPTION OF EXEMPLARY EMBODIMENTS OF THE INVENTION

The detailed reaction and effect of the example disclosed PCB having reduced mounting height may be understood by the following description.

Figure 1:
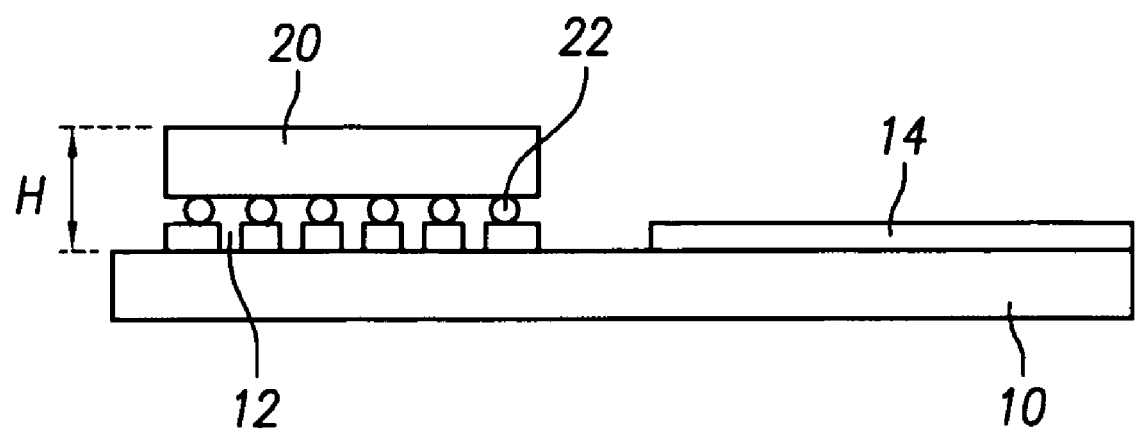
FIG. 1 is a cross-sectional view of conventional mounting structure of BGA package onto a PCB.
Figure 2:
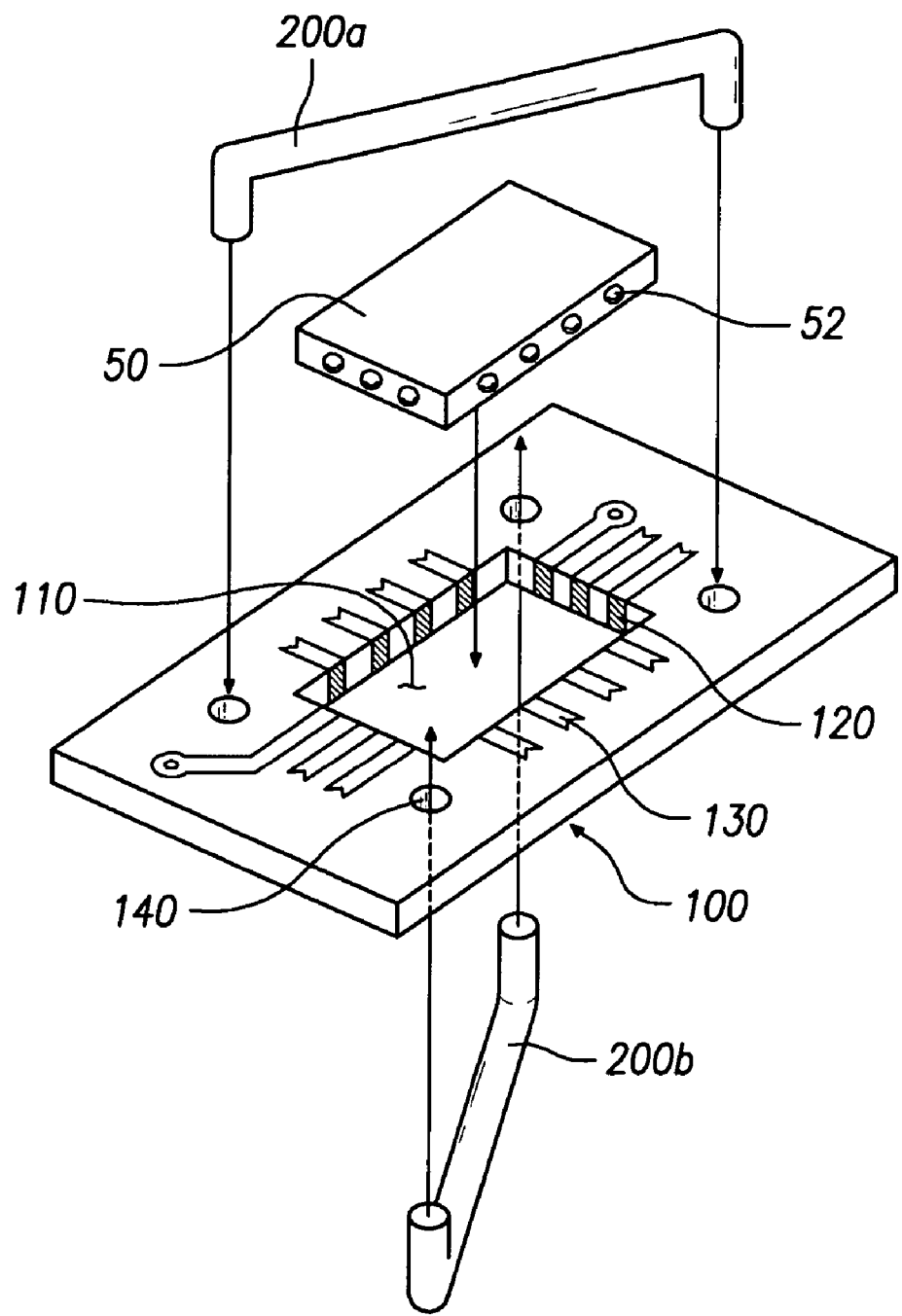
FIG. 2 is a perspective view illustrating the structure of PCB according to an embodiment of the present invention.
Figure 3:
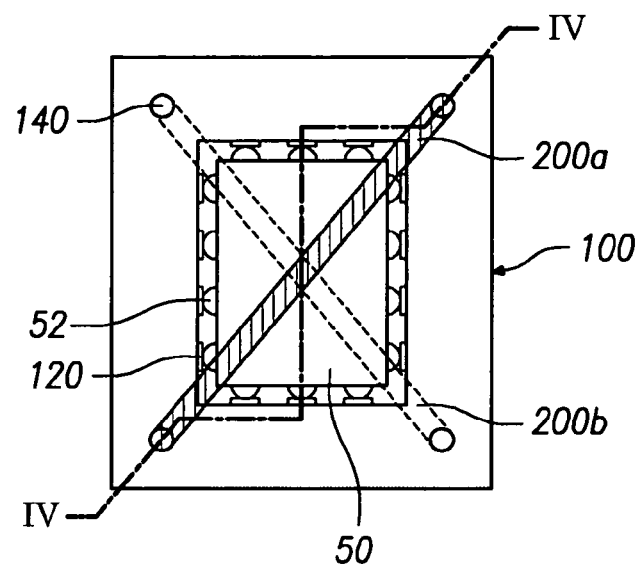
FIG. 3 is a plan view showing the structure of PCB according to an embodiment of the present invention.
Figure 4:
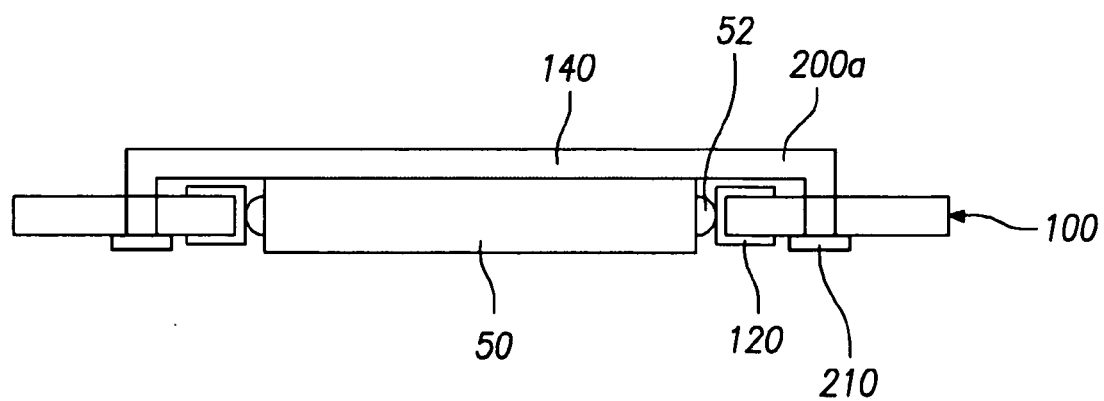
FIG. 4 is a cross-sectional view of PCB according to an embodiment of the present invention, when taken along line IV-IV of FIG. 3.

FIG. 2 is a perspective view of a PCB according to an embodiment of the present invention, FIG. 3 is a plan view showing the structure of PCB according to an embodiment of the present invention, and FIG. 4 is a cross-sectional view of PCB according to an embodiment of the present invention, when taken along line IV-IV of FIG. 3.

Referring to FIGS. 2 to 4, the PCB 100 includes an opening 110 to which a semiconductor package 50 is received, a plurality of board connectors 120, wiring patterns 130, four holes 140, and fastening metal rods 200a and 200b.

The semiconductor package 50 has a plurality of external connections 52 protruding from side surfaces of package body. This structure of package 50 is disclosed in Korean Patent Application No. 2004-117675 filed by the assignee on Dec. 31, 2004 and entitled "Semiconductor Package Device Having Reduced Mounting Height and Method for Manufacturing the Same", which is incorporated herein by reference.

The external connections 52 can be solder balls or solder bumps.

While the PCB 100 is shown in FIG. 2 to have single metal wiring layer, a person of ordinary skill in the art would easily understand that the PCB 100 can include a number of insulation and metal layers selectively patterned to provide the wiring patterns. Therefore, the PCB 100 can include single side PCB, double side PCB, and multi-layered board. The metal for the wiring patterns 130 includes Cu, Au, Ag, Fe, W, Al, Ni, Co or their alloys, and the insulation layer can be made of epoxy resin.

Further, a plurality of electronic components are mounted on one or more surfaces of the PCB 100 and functionally interconnected through the wiring patterns 130, which are omitted for simplicity in FIGS. 2 and 3. The signals that are transmitted between the electronic components and the package device 50 are carried by the board connector 120 and wiring pattern 130.

When the package device 50 is mounted into the opening 110, the external interconnections 52 of the package are soldered to the board connectors 120 formed on sidewalls of the opening 110. Then, the fastening metal rods 200a and 200b are inserted into respective holes 140 to fasten the package device 50 received in the opening 110. It is preferable to place the upper and lower metal rods 200a and 200b while crossing the package 50 in diagonal direction as shown in FIG. 3. Further, the metal rods 200a and 200b have legs with lengths that are long enough to make the top and bottom surfaces of the package 50 contact the metal rods 200a and 200b as shown in FIG. 4. The fastening metal rods 200a and 200b can be coupled by the corresponding fastening rings 210. The diameter or width of the fastening metal rods 200a and 200b is smaller than the diameter of the hole 140, and the size of the fastening ring 210 is greater than the diameter of the hole 140.

In FIGS. 2 and 4, the opening 100 is shown to penetrate the circuit board in vertical direction. However, in another embodiment of the present invention, the opening can have a well structure (not shown). That is, the opening can have one opened end and the other closed end. The well structure of the opening can be used when the package device 50 has a thickness greater than the thickness of the PCB. With this structure of the opening, the fastening metal rod 200b can be omitted, and the package device 50 is attached to the closed surface of the opening.

With this mounting structure of BGA package, the mounting density in vertical direction is significantly enhanced because the mounting height is reduced by both the thickness of the circuit board and the size of connections 52. Therefore, the mounting height of the present invention structure is greatly decreased than the convention BGA structure.

Figure 5A:
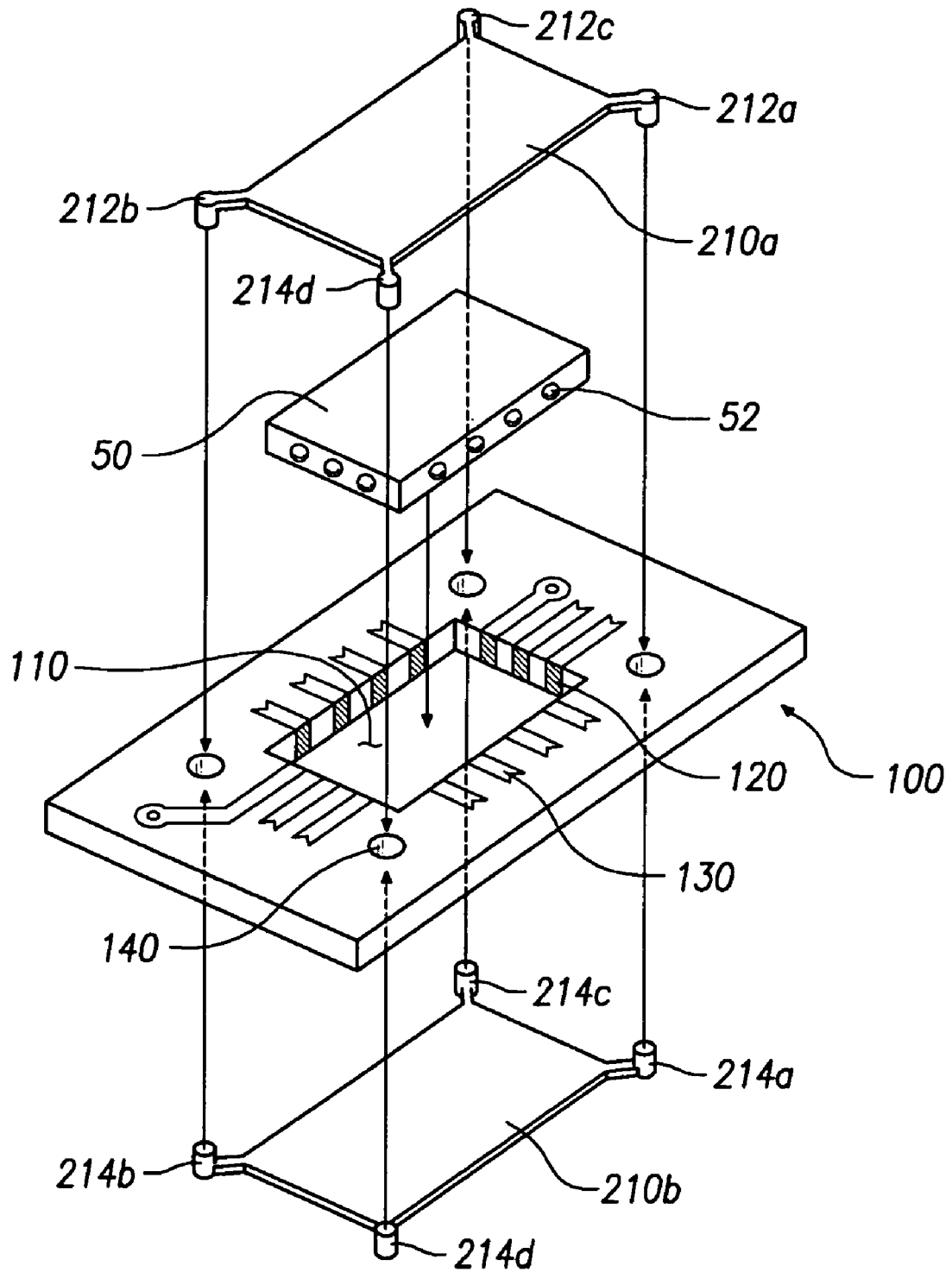
FIGS. 5A and 5B are perspective view and cross-sectional view of PCB according to another embodiment of the present invention, respectively.
Figure 5B:
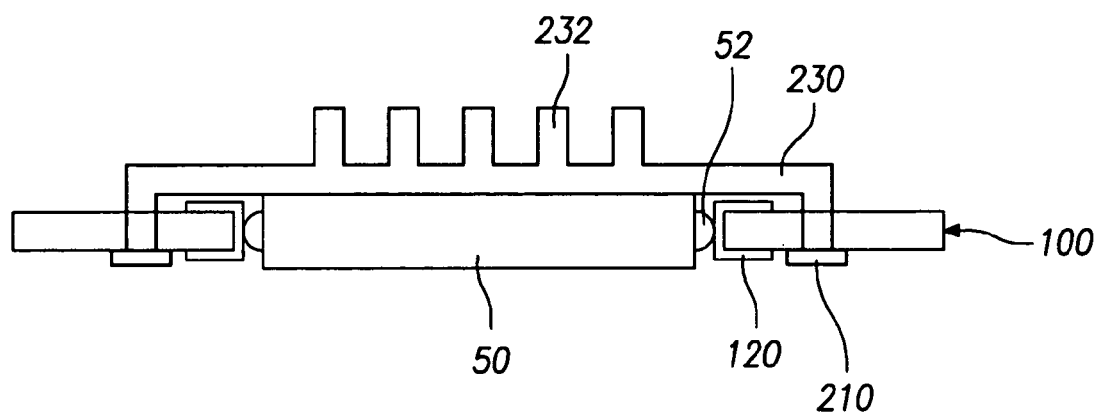

FIGS. 5A and 5B are perspective view and cross-sectional view of PCB according to another embodiment of the present invention, respectively.

Referring to FIG. 5A, an upper fastening sheet 210a having four legs 212a to 212d at its corners are coupled to the board by inserting the legs 212a to 212d into the holes 140 at the top surface of the PCB 100, and, in the same way, a lower fastening sheet 210b having four legs 214a to 214d at corners are coupled to the PCB 100. When compared with the metal rods 200a and 200b of FIGS. 2 to 4, the fastening sheets 210a and 210b have larger area, thereby enhancing the holding strength to the package 50 and heat dissipation from the package 50.

For further enhancing the heat dissipation of the fastening sheets from the package 50, a number of fins or heat sinks 232 can be provided in an upper fastening sheet 230 as shown in FIG. 5B.

FIGS. 6A to 6D are cross-sectional views illustrating the process for forming the board connectors 120 in the PCB 100 according to the present invention.

Figure 6A:
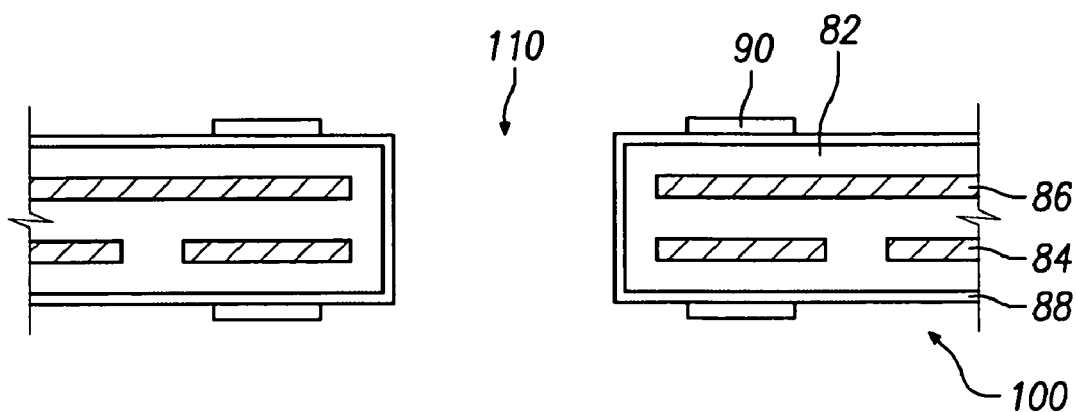
FIGS. 6A to 6D are cross-sectional views illustrating interior structure of PCB according to the present invention.

Referring to FIG. 6aA, the opening 120 is formed in a board having two internal metal layers 84 and 86 in insulating material 82. The opening 120 can be formed by mechanical drilling or punching process. Then, first copper layer 88 is formed by an electroless plating to cover the entire outer surface of the board and sidewalls of the opening 120. Then, plating mask layer 90, which defines patterns for the board connectors and wiring patterns connected to the board connectors, is formed on the first copper layer 88.

Figure 6B:
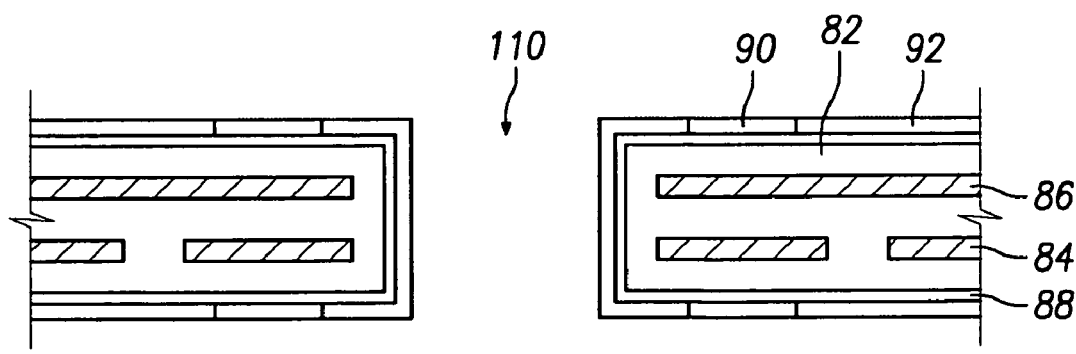

Referring to FIG. 6B, second copper layer 92 is formed by electrolytic plating method on the first copper layer 88 excepting portions on the plating mask layer 90. The electrolytic plating for the second copper layer 92 can be performed by connecting the board to anode and with using e.g., $CuSO_4$, $H_2O$, $H_2SO_4$ and HCL solution added by carrier.

Figure 6C:
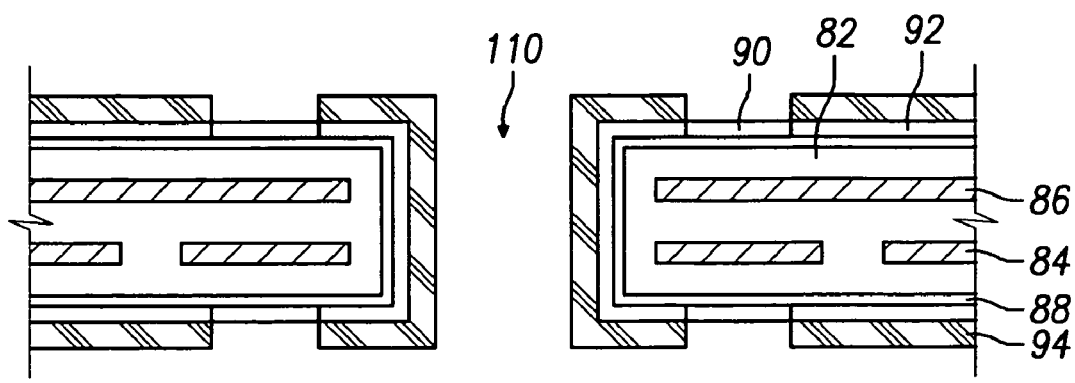

Referring to FIG. 6C, solder plating is carried out to form a solder plating layer 94 on the second copper layer 92. Like the second copper layer 92, the solder plating layer 94 does not plated on the plating mask layer 90.

Figure 6D:
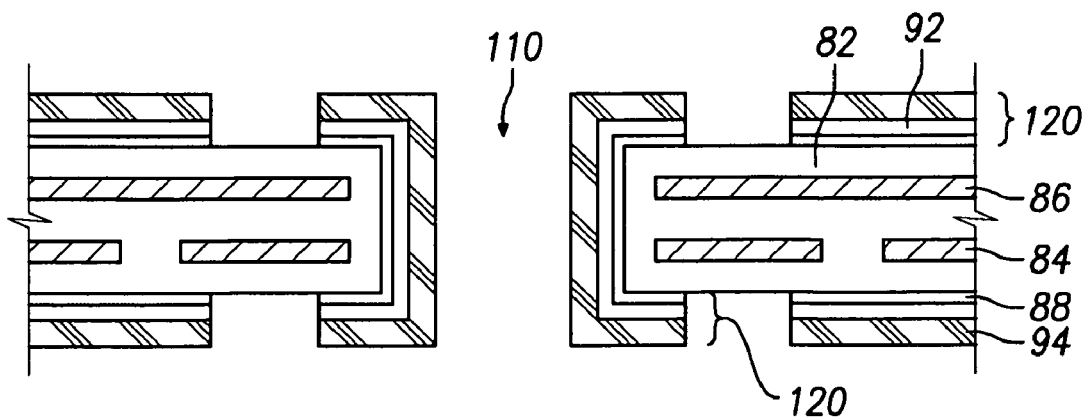

Referring to FIG. 6D, the plating mask layer 90 is removed and the underlying portion of the first copper layer 88 is selectively etched away from the board. Then, the board connector 120 consisted of the first copper layer 88, second copper layer 92 and solder plating layer 94 is obtained.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A printed circuit board comprising:
    an opening configured to receive a semiconductor package having a plurality of external connections which protrude externally from side surfaces of the semiconductor package;
    a plurality of board connectors electrically interconnected to the plurality of external connections of the package and formed on a sidewall of the opening;
    wiring patterns for electrically interconnect electronic components mounted on the printed circuit board and being electrically interconnected to the plurality of board connectors;
    a plurality of holes penetrating the printed circuit board; and
    fastening means inserted into the plurality of holes and for fastening the semiconductor package received in the opening,
    wherein the opening is formed to penetrate the printed circuit board.

2. The printed circuit board of claim 1, wherein the plurality of external connections are made of solder balls.

3. The printed circuit board of claim 1, wherein the fastening means includes metal rods crossing the semiconductor package in diagonal directions of the opening.

4. The printed circuit board of claim 1, wherein the fastening means includes metal sheets.

5. The printed circuit board of claim 4, wherein the metal sheet fastening means includes heat sink.

6. The printed circuit board of claim 1, wherein the board connector comprises stacked layers of an electroless metal layer, an electrolytically plated metal layer and a solder plating layer.

7. A printed circuit board comprising:
an opening configured to receive a semiconductor package having a plurality of external connections which protrude externally from side surfaces of the semiconductor package;
a plurality of board connectors electrically interconnected to the plurality of external connections of the package and formed on a sidewall of the opening;
wiring patterns for electrically interconnect electronic components mounted on the printed circuit board and being electrically interconnected to the plurality of board connectors;
a plurality of holes penetrating the printed circuit board; and
a fastener inserted into the plurality of holes and configured to fasten the semiconductor package received in the opening,
wherein the opening is formed to penetrate the printed circuit board.

8. The printed circuit board of claim 7, wherein the plurality of external connections are made of solder balls.

9. The printed circuit board of claim 7, wherein the fastener is a metal rod crossing the semiconductor package in a diagonal direction.

10. The printed circuit board of claim 7, wherein the fastener is a metal sheet.

11. The printed circuit board of claim 10, wherein the metal sheet includes a heat sink.

12. The printed circuit board of claim 7, wherein the board connector comprises stacked layers of an electroless metal layer, an electrolytically plated metal layer and a solder plating layer.

* * * * *